(12) United States Patent
Lo et al.

(10) Patent No.: US 7,916,529 B2
(45) Date of Patent: Mar. 29, 2011

(54) PIN DIODE DEVICE AND ARCHITECTURE

(75) Inventors: Wai Lo, Palo Alto, CA (US); Christie Marrian, San Jose, CA (US); Tzu-Ning Fang, San Jose, CA (US); Sameer Haddad, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 119 days.

(21) Appl. No.: 12/370,932

(22) Filed: Feb. 13, 2009

(65) Prior Publication Data

US 2010/0208517 A1 Aug. 19, 2010

(51) Int. Cl.
*G11C 11/36* (2006.01)
(52) U.S. Cl. ........ 365/175; 365/115; 365/100; 365/148; 365/230.06; 365/189.04
(58) Field of Classification Search ................... 365/175, 365/100, 148, 115, 207, 196, 230.06, 189.04
See application file for complete search history.

(56) References Cited

U.S. PATENT DOCUMENTS

| | | | |
|---|---|---|---|
| 6,021,066 A | 2/2000 | Lam | |
| 7,120,062 B2 | 10/2006 | La Malfa et al. | |
| 7,120,063 B1 | 10/2006 | Liu et al. | |
| 7,324,374 B2 | 1/2008 | Shieh et al. | |
| 7,372,743 B2 | 5/2008 | Yano et al. | |
| 7,385,851 B1 | 6/2008 | Park et al. | |
| 7,433,228 B2 | 10/2008 | Kuo et al. | |
| 7,561,465 B2 | 7/2009 | Hancock et al. | |
| 2009/0034355 A1* | 2/2009 | Wang | 365/230.01 |

OTHER PUBLICATIONS

Lee, K. J. et al., "A 90nm 1.8V 512Mb Diode-switch PRAM with 266MB/s Read Throughput," 2007 IEEE International Solid-state Circuits Conference, Digest of Technical Papers, vol, 50, Feb. 2007, p. 472.
Oh, J. H. et al., "Full Integration of Highly Manufacturable 512Mb PRAM based on 90nrn Technology," IEDM 2006, Technical Digest, 5 pages.
Hosoi, Y. et al., "High Speed Unipolar Switching Resistance RAM(RRAM) Technology," IEDM 2006, Technical Digest, 5 pages.
Song, Y. J. et al., "Highly Reliable 256Mb PRAM with Advanced Ring Contact Technology and Novel Encapsulating Technology," 2006 Symposium on VLSI Technology Digest of Technical Papers, 2 pages.

* cited by examiner

*Primary Examiner* — Thong Q Le
(74) *Attorney, Agent, or Firm* — Matthew W. Gaffney; Frommer Lawrence & Haug

(57) ABSTRACT

A memory architecture that employs one or more semiconductor PIN diodes is provided. The memory employs a substrate that includes a buried bit/word line and a PIN diode. The PIN diode includes a non-intrinsic semiconductor region, a portion of the bit/word line, and an intrinsic semiconductor region positioned between the non-intrinsic region and the portion of the bit/word line.

20 Claims, 7 Drawing Sheets

PIN DIODE DEVICE AND ARCHITECTURE

FIELD OF THE INVENTION

The invention is related to microelectronic devices employed in a memory, and in particular but not exclusively, to a diode for accessing a memory cell.

BACKGROUND OF THE INVENTION

A memory, such as a random access memory (RAM) or read only memory (ROM) often includes arrayed memory cells. Typically, each of the memory cells is coupled to at least one bit line and an overlapping word line, and each of the memory cells include a memory element that is configured to store a logic state. In operation, a memory controller reads from and/or writes to an individual memory element by receiving and transmitting signals over the bit and word lines of the memory. When a memory cell receives a signal, it employs a select device, such as a transistor switch that is activated by the bit line and/or the word line.

BRIEF DESCRIPTION OF THE DRAWINGS

Non-limiting and non-exhaustive embodiments of the present invention are described with reference to the following drawings, in which.

DETAILED DESCRIPTION

Figure 1:
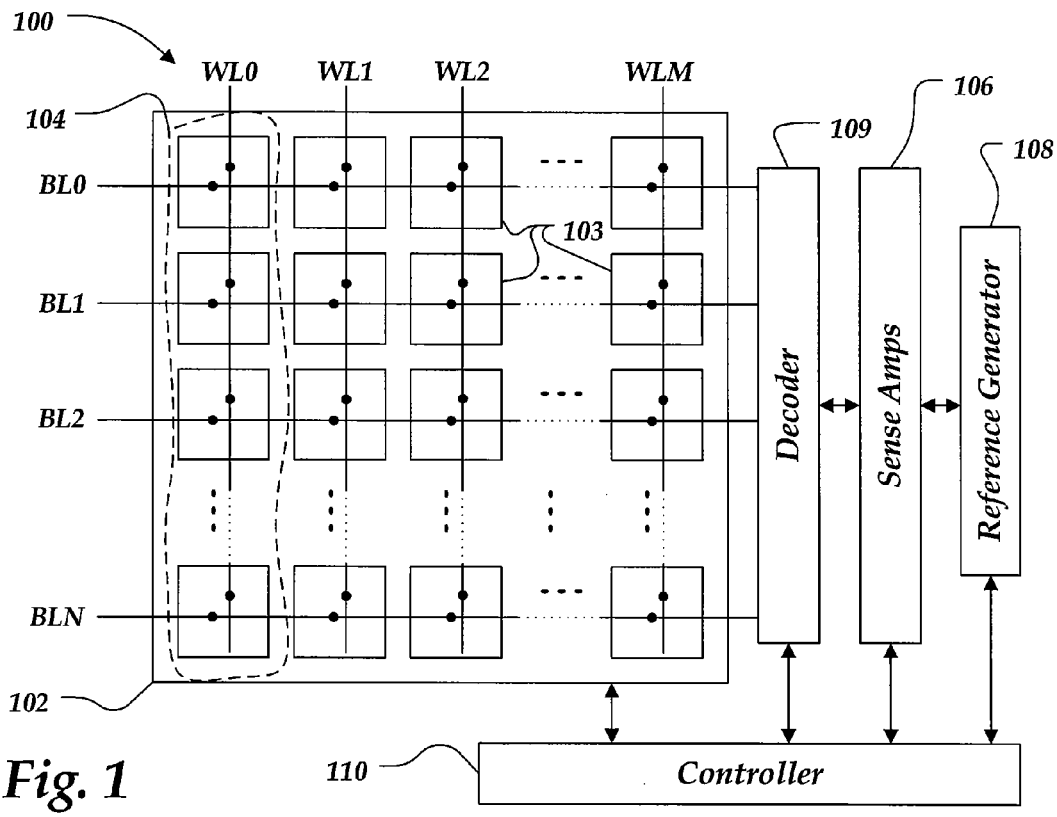
FIG. 1 is a block diagram of an embodiment of a memory.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

The term "substrate" as used herein refers to any of a wide variety of supporting materials in which microelectronic devices and other structures of a memory may be formed. In general, a substrate includes one or more semiconductor materials, such as a group IV semiconductor material (e.g., silicon or germanium) or compound semiconductor materials (e.g., Gallium Arsenide, Indium Phosphide, and the like). Although primarily discussed in the context of silicon-based semiconductor processing, other embodiments of substrates may be employed in the context of non-silicon based semiconductor processing.

The term "memory cell" as used herein refers to a portion of a memory that is configured to store at least one logic level in a memory. In one embodiment, a memory cell can be configured to store a bit or binary datum indicative of a logic level, such as a "0" or a "1." In another embodiment, a memory cell can have one of three or more logic levels. In general, a memory cell is typically arrayed with other memory cells to store an amount of data spanning, for example, a Byte, a Kilobyte, Megabyte, Gigabyte, a Terabyte, and larger. Such arrayed memory cells can be arranged in any of a wide variety of volatile and nonvolatile memories, including ROM and RAM. In one embodiment, memory cells can be flash memory cells, such as single-bit, dual-bit, or multi-bit flash memory cells. In other embodiments, memory cells can be SRAM, DRAM, EPROM, or EEPROM memory cells.

The term "bit/word line" as used herein refers to a conductive structure that is configured to electrically intecouple portions of a memory. For example, a bit/word line can include a bit line for coupling one or more memory cells with a sense amp. In addition, a bit/word line can include a word line for coupling one or more memory cells with a memory controller.

The term "PIN diode" as used herein refers to a semiconductor diode that includes a non-intrinsic p-type semiconductor region, a non-intrinsic n-type semiconductor region, and an intrinsic semiconductor region positioned between the p-type and n-type regions. As used herein the term non-intrinsic refers to degenerate levels of doping, and the term intrinsic refers to no level of doping or light doping. For example, in silicon, an intrinsic region as defined herein can have a net acceptor (atom or species) concentration of up to about $1 \times 10^{16}$ cm$^{-3}$ or a net donor (atom or species) concentration of up to about $1 \times 10^{16}$ cm$^{-3}$. Further, as used herein the term "NiP diode" is interchangeable with the term PIN diode, although in some embodiments, a NiP diode can be used to refer to a reverse bias configuration of a PIN diode.

Briefly stated, the invention is related to a memory architecture that employs one or more semiconductor PIN diodes. The memory employs a substrate that includes a buried bit/word line and a PIN diode. The PIN diode includes a non-intrinsic semiconductor region, a portion of the bit/word line, and an intrinsic semiconductor region positioned between the non-intrinsic region and the portion of the bit/word line. In one embodiment, the PIN diode is configured as a select device for accessing at least one memory cell. In another embodiment, the PIN diode forms a portion of a memory cell, such as a two-terminal memory cell or other memory cell.

FIG. 1 shows components of one embodiment of an environment in which the invention may be practiced. Not all the components may be required to practice the invention, and variations in the arrangement and type of the components may be made without departing from the spirit or scope of the invention. As shown, memory 100 of FIG. 1 includes memory array 102 and individual memory cells 103 located within memory array 102. Memory cells 103 are arranged in N+1 rows and M+1 columns in memory array 102. Each row of memory array 102 is accessed by one of bit lines BL0-BLN. Each column of memory array 102 is accessed by one of word lines WL0-WLM. Accordingly, each of memory cells 103 can be accessed by activating a corresponding bit line and a corresponding word line of the cell. In one embodiment, each column of memory array 102 defines a data word. If N+1 has a value of 8, for example, the cells in each column of memory array 102 define a byte of data.

Memory 100 can also include reference generator 106, sense amps 108, decoder 109, and memory controller 110. Reference generator 106 is configured to provide a reference signal (e.g., a reference voltage or a reference current). Sense amps 108 are configured to provide read data by comparing the reference signal to sensed signals from individual memory cells 103. For example, when word line WL0 is activated, sense amps 108 can provide read data corresponding to each of the memory cells in column 104 or a portion of the memory cells in column 104. Sense amps 108 are also configured to write individual memory cells 103. For example, sense amps 108 can provide separate write signals to each of the memory cells in column 104 or a portion of the memory cells in column 104 to write a logic state to these memory cells.

Decoder 109 is configured to selectively couple individual sense amps 108 to individual memory cells 103 for reading and/or writing. In one embodiment, decoder 109 includes a sector decoder. As such, decoder 109 may be arranged to selectively couple individual sense amps 108 to a particular column or grouping of columns within memory 100. For example, a grouping of columns may define a sector, and another grouping of columns may define another sector. In another embodiment, memory 100 may include an array decoder for selectively coupling sense amps 108 to memory array 104 or another array of memory 100 (not shown). For example, decoder 109 may form a portion of such an array decoder. In addition, embodiments of array decoders can be configured to work separately or in conjunction with a sector decoder.

Memory controller 110 is configured to drive the various components of the memory 100, including reference generator 106, sense amps 108, and decoder 109. Memory controller 110 is also configured to activate and de-activate individual word lines WL0-WLM for reading and/or writing to memory array 102. For example, memory controller 110 can provide a select signal to one of the columns WL1-WLM to activate that column. Further, memory controller 110 can provide a select signal to decoder 109 for selecting a particular one or rows BL0-BLN (or sector) to be written to or read from.

In general, embodiments of memory 100 can be configured differently. For example, components may be added to or omitted from memory 100 and/or components may be combined in memory 100. In one embodiment, word lines WL0-WLM may be arranged in rows (instead of columns), and bit lines BL0-BLN may be arranged in columns (instead of rows). Further, other arrangements of bit lines and word lines are possible. In the embodiment shown in FIG. 1, an individual one of memory cells 103 is typically referred to as a two terminal memory cell because it is coupled to one word line and one bit line. In another embodiment, an individual memory cell can have three terminals, for example, if such a memory cell is coupled to one word line and two bit lines. Further, embodiments of memory cells 103 can be configured to receive any of a wide variety of current and/or voltage signals for reading and/or writing to individual memory cells. In one embodiment, a memory cell can receive a specific level of current or voltage for reading and/or writing to the memory cell. In another embodiment, a memory cell can receive a combination of current and voltage signals for reading and/or writing the memory cell.

Figure 2:
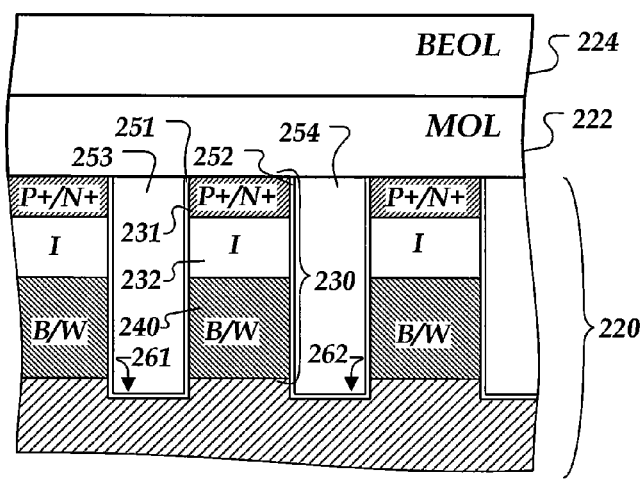
FIG. 2 is a cross-sectional side view of an embodiment of a PIN diode.

FIG. 2 shows a cross-sectional side view of substrate 220 carrying an embodiment of a PIN diode that may be employed in an embodiment of memory 100 of FIG. 1. Substrate 220 includes PIN diode 230 spanning a vertical portion of substrate 220 and a buried bit/word line 240 that spans a lateral portion of substrate 220 that is generally perpendicular to PIN diode 230. Substrate 220 is a front end of line (FEOL) layer that carries a middle of line (MOL) layer 222 and a back end of line (BEOL) layer 224.

PIN diode 230 includes non-intrinsic semiconductor region 231 and intrinsic semiconductor region 232 positioned between non-intrinsic region 231 and bit/word line 240. Pin diode 230 also includes a portion of bit/word line 240 that provide another non-intrinsic region of PIN diode 230. In one embodiment, bit/word line 240 may be employed as an embodiment of an individual one of bit lines BL1-BLN of FIG. 1. In another embodiment, bit/word line 240 may be employed as an embodiment of an individual one of word lines WL1-WLM of FIG. 1. In one embodiment, bit/word line 240 is n-type and non-intrinsic region 231. In another embodiment, bit/word line 240 is p-type and non-intrinsic region 231 is n-type.

PIN diode 230 is vertically positioned between bit/word line 240 and MOL layer 222 such that PIN diode 230 is electrically connected at one side to MOL layer 222 and at another side to bit/word line 240. Thus, embodiments of PIN diode 230 can have a small vertical footprint. Conventional diodes, by contrast, have a larger footprint because they require two electrical connections at one side. For example, conventional diodes require two electrical contacts at the interface between a FEOL layer and a MOL layer.

PIN diode 230 may be coupled to devices and components located in any one of substrate 220, MOL layer 222, and BEOL layer 224. MOL layer 262 can include, for example, deposited layers that interface with substrate 220 (e.g., silicide, metal contacts, polysilicon, and the like). BEOL layer 224 can include, for example, alternating layers of metal and dielectric material that provide an electrical connection to portions of MOL layer 222 and substrate 220 (e.g., inter-level dielectric layers, metal lines, vias, and contacts). Also, PIN diode 230 can be passivated with sidewall dielectrics 251 and 252, and PIN 230 diode can be isolated from other FEOL devices via isolation dielectrics 253 and 254. Further, silicon recesses 261 and 262 can be employed to mitigate leakage currents.

In one embodiment, PIN diode 230 can be configured as a select device for reading from or writing to a memory cell located in MOL layer 222 and/or BEOL layer 224. For example, PIN diode 230 can be configured to provide a specific voltage across the memory cell (e.g., across an overlapping bit line and world line) and/or to provide a specific current to the memory cell.

In general, PIN diode 230 can operate in a similar manner as a conventional PN diode by rectifying a voltage and/or regulating current. Unlike a conventional PN diode, however, PIN diode 230 includes intrinsic region 232 for reducing the slope of band bending between non-intrinsic region 231 and bit/word line 240 (in contrast to the abrupt junction in a conventional PN diode). Thus, PIN diode 230 has a higher break down voltage than a conventional PN diode. Also, the break down voltage can be adjusted by increasing or decreasing the separation distance between non-intrinsic region 231 and bit/word line 240. Further, in some embodiments intrinsic region 232 can be lightly doped n-type or p-type. For example, lightly doping intrinsic region 232 can adjust the amount of carrier injection into intrinsic region 232.

PIN diode 230 may be coupled to any of a variety of components for storing a logic state. Embodiments of logic state components may include, for example, a transistor, a capacitor, a resistor, or a combination of such components. Further, a logic state component may be located in any one of a FEOL layer, a MOL, and/or a BEOL layer. In the embodiments described below, a logic state component includes a resistive or phase-change memory element arranged to change resistive state or phase state based, at least in part, on a regulated current, rectified voltage, or other signal or combination of signals provided by the PIN diode. Other types of memory elements or configurations of memory elements and/or logic state components, however, are possible.

Figure 3A:
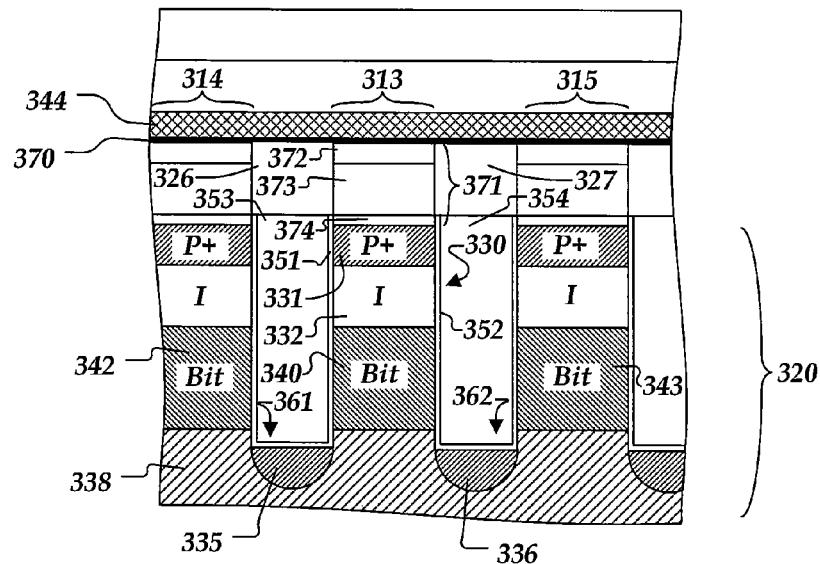
FIGS. 3A and 3B are cross-sectional side views of an embodiment of a PIN diode that is coupled to a memory cell.
Figure 3B:
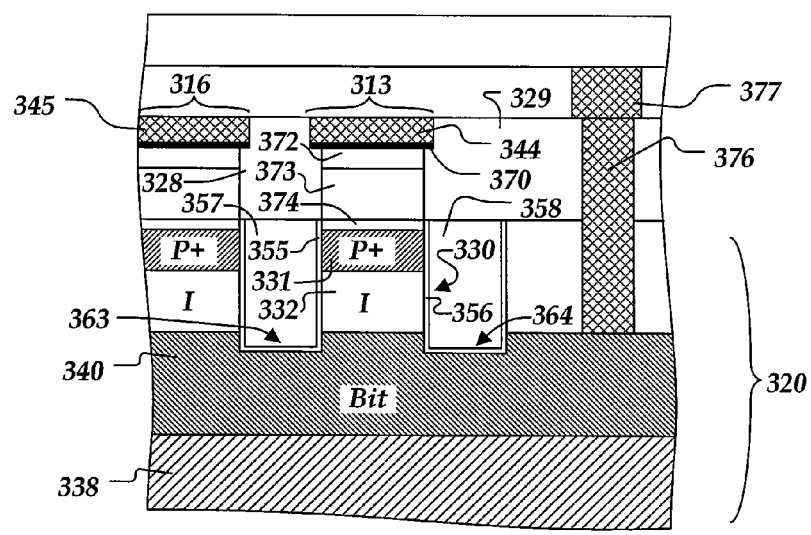

FIGS. 3A and 3B show two cross-sectional side views of PIN diode 330 coupled to memory cell 313. PIN diode 330 may be an embodiment of PIN diode 230 of FIG. 2. Memory cell 313 may be an embodiment of one of individual memory cells 103 of FIG. 1. In one embodiment, FIG. 3A may be a cross-section of an individual memory cell taken along a portion of one of word lines WL0-WLM of FIG. 1, and FIG. 3B may be a cross-section of the individual memory cell taken along a portion of one of overlapping bit lines BL0-BLN of FIG. 1.

Turning first to FIG. 3A, memory cell 313 is coupled to PIN diode 330 and includes a portion of memory element 370 and electrode contact 371 coupled between PIN diode 330 and memory element 370. PIN diode 330 is formed in substrate 320 and includes P+ region 331, intrinsic region 332, and a portion of bit line 340. Bit line 340 is n-type and is buried beneath intrinsic region 332. Bit line 340 may include, for example, an embodiment of any one of bit lines BL1-BLM of FIG. 1 and/or bit/word line 240 of FIG. 2.

PIN diode 330 can be electrically isolated from adjacent memory cells 314 and 315 and adjacent bit lines 341 and 342. Such electrical isolation can be carried out by sidewall dielectrics 351 and 352, isolation dielectrics 353 and 354, and/or recesses 361 and 362. In addition, P+ isolation regions 335 and 336, formed in P body region 338, can provide further electrical isolation.

Memory element 370 is coupled to word line 344, which may include, for example, an embodiment of any one of word lines WL1-WLN of FIG. 1. Memory element 370 includes one more layers of at least one microelectronic material that is configured to store a logic level of memory cell 313. Memory element 370 can include, for example, a deposited material (i.e., a film) or a material that is grown from a microelectronic substrate (i.e., an oxide). In one embodiment, memory element 370 can include a material that changes state, such as a resistive state for indicating of one of at least two logic levels. In a non-illustrated embodiment, memory element 370 can be patterned such that it is configured to store a voltage and/or a charge.

Electrode contact 371 couples memory element 370 to PIN diode 330. Electrode contact 371 includes bottom electrode 372, diode contact 373, and silicide contact 374. Electrode contact 371 is isolated from other devices via inter-level dielectric regions 386 and 387 of a BOEL or MOL layer. In one non-illustrated embodiments, electrode contact 371 may include additional or alternative layers for coupling PIN diode 330 with memory element 370. Accordingly, electrode contact 371 may have a footprint that is defined by bottom electrode 372, diode contact 373, silicide region 374, memory element 370, and/or other materials positioned between PIN Diode 330 and memory element 370. In one embodiment, electrode contact 371 has a footprint that is greater than a footprint defined by P+ region 331 and/or intrinsice region 332 of PIN diode 330. In another embodiment, electrode contact 371 has a footprint that is generally the same as a footprint defined by P+ region 331 and/or intrinsice region 332 of PIN diode 330.

In one embodiment, word line 344, memory element 370, and bottom electrode 372 are part of a lower level of a BEOL layer, and diode contact 373 and silicide contact 374 are part of a MOL layer. In other embodiments, however, other locations are posssible. In one non-illustrated embodiment, memory element 370, bottom electrode 372, diode contact 373, and silicide contact 374 may be integrated into an FEOL layer. In another non-illustrated embodiment, word line 344, memory element 370, and bottom electrode 372 may be incorporated into a middle and/or upper level of a BEOL layer.

Turning now to FIG. 3B, another cross-sectional side view of PIN diode 330 and memory cell 313 is shown. In this view, bit line 340 extends laterally beneath intrinsic region 332 of PIN diode 330 and the intrinsic region of adjacent memory cell 316. Also, word line 344 is isolated from adjacent word line 345 via inter-level dielectric region 328. Sidewall dielectrics 355 and 356, isolation dielectrics 357 and 358, and/or recesses 363 and 364 can isolate non-intrinsic region 331 and intrinsic region 332 from other portions of substrate 320. Similarly, inter-level dielectric regions 328 and 329 can isolate memory element 370, bottom electrode 372, diode contact 373, silicide contact 374, and word line 344 from other portions of an MOL layer or BEOL layer.

Also, interconnect 376 can couple bit line 340 to a metal line or contact 377 of a BEOL layer. In one embodiment, interconnect 376 is a single layer of connecting material, such as a metal via. In another embodiment interconnect 376 includes multiple layers of connecting materials, such as multiple metal vias, metal lines and/or conductive semiconductor material. For example, interconnect 376 may include multiple levels of metal vias to accommodate a high aspect ratio.

FIGS. 4-12 illustrate various stages of manufacturing PIN diode 330 and memory cell 313 in accordance with various embodiments of the present invention. Unless indicated otherwise, FIGS. 4-12 generally correspond to a cross-sectional view taken along the same plane as that of FIG. 3A.

Figure 4:
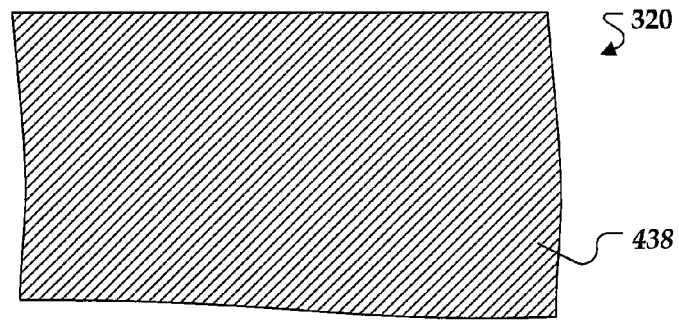
FIGS. 4-11B are cross-sectional side views of various stages of manufacturing the PIN diode and memory cell of FIGS. 3A and 3B.

FIG. 4 is a cross-sectional side view of substrate 320 having a initial p-type doping 438 (e.g., boron or aluminum). Substrate 320 can include any of a variety of substrates. In one embodiment, substrate 320 is a portion of a bulk silicon wafer. In general, background doping 438 can be selected to ensure low resistivity but maintain a high reverse breakdown voltage at the junction with bit line 340 of FIGS. 3A and 3B. In one non-illustrated embodiment, substrate 320 does not have an initial doping, and P-body region 338 of FIGS. 3A and 3B is formed by ion implantation. In another non-illustrated embodiment, substrate 320 is a portion of a bulk silicon-on-insulator (SOI) wafer. In such an embodiment, P body region 338 (FIGS. 3A and 3B) may be separated from a bulk silicon layer (not shown) through a buried oxide layer (not shown).

Figure 5:
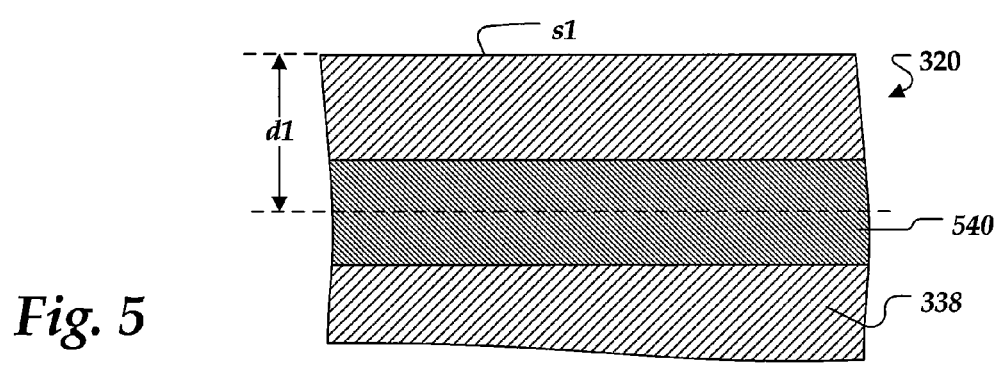

FIG. 5 is a cross-sectional side view of substrate 320 after forming bit line region 540. Bit line region 540 has an electron majority carrier type. Accordingly, bit line region 540 is formed by performing one or more implantation steps of an n-type implant species (e.g., phosphorus (P), arsenic (As), or antimony (Sb)). Bit line region 540 has an average depth (d1) from a front surface (s1) of substrate 320 that is based on an energy of the implantation step(s). Bit line region 540 also has an impurity concentration that is based on the dose of the implantation step(s). In one embodiment, the donor concentration can be selected to maintain a low resistance in the silicon portion of bit line 340 of FIGS. 3A and 3B (e.g., on the order of about $1 \times 10^{20}$ cm$^{-3}$). FIG. 5 also shows bit line region 540 defining the location of P body region 338 of FIGS. 3A and 3B.

Figure 6:
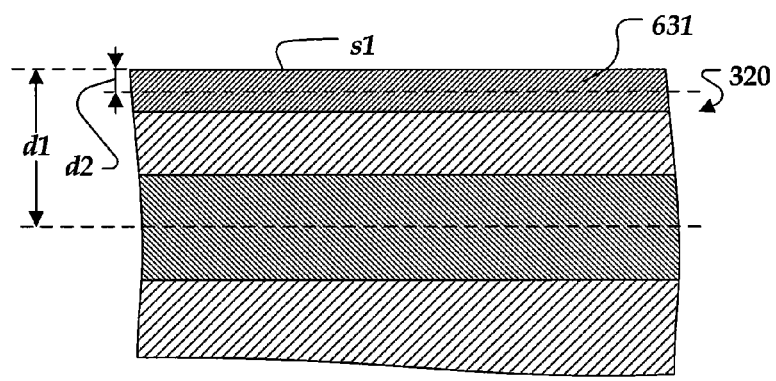

FIG. 6 is a cross-sectional side view of substrate 320 after forming P+ region 631. P+ region 631 has a hole majority carrier type. Accordingly, P+ region 631 is formed by performing one or more implantation steps of a p-type implant species. P+ region 631 has an average depth (d2) from the front surface (s1) of substrate 320 that is less than the average depth (d1). The average depth (d2) may be based on an energy of the implantation step(s). Also, the impurity concentration of P+ region 631 can be based on the dose of the implantation step(s). In one embodiment, the impurity concentration of P+ region 631 has a density that is selected to maintain a low contact resistance with silicide contact 374 FIGS. 3A and 3B. In addition or alternatively, the impurity concentration of P+ region 631 can be configured to prevent charge depletion in intrinsic region 332 of FIGS. 3A and 3B at low reverse bias. For example, the density of P+ region 631 can be configured to prevent charge depletion of an intrinsic region at voltages in the range of about 2-5 V.

Figure 7:
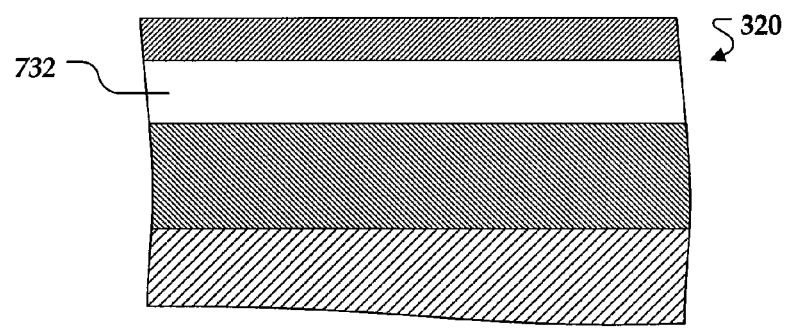

FIG. 7 is a cross-sectional side view of substrate 320 after forming intrinsic region 732. In one embodiment, intrinsic region 732 may be formed by ion implantation. For example, intrinsic region 732 can be lightly doped n-type (alternatively intrinsic region can be lightly doped p-type when employing a p-type bit line). In general, intrinsic region 732 can be configured to ensure a high reverse breakdown voltage and maintain a high charge carrier mobility in PIN diode 330 of FIGS. 3A and 3B. In other non-illustrated embodiment, intrinsic region 732 may be configured to have a native, intrinsic carrier concentration (i.e., about $1.5 \times 10^{10}$ cm$^{-3}$ at 300 K).

Figure 8A:
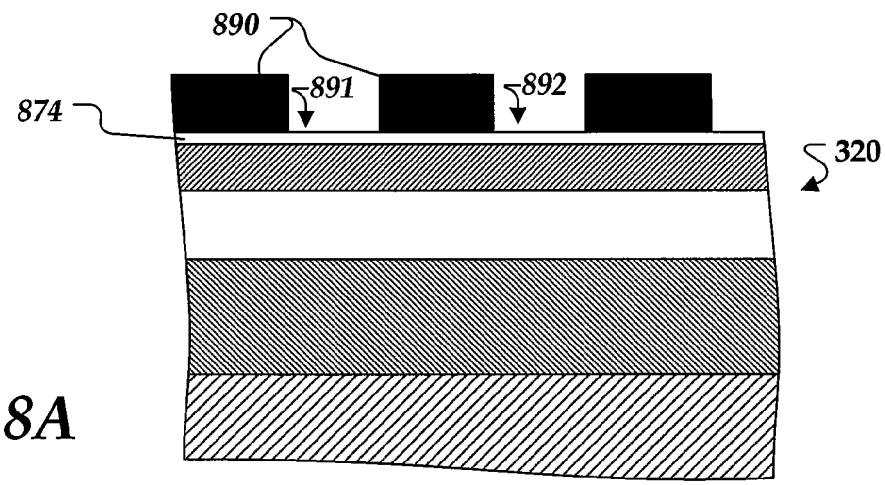

FIG. 8A is a cross-sectional side view of substrate 320 after undergoing a salicide process to form silicide region 874 and after forming a mask layer 890 on top of silicide region 874. Silicide region 874 includes a metal silicide (e.g., titanium silicide or cobalt silicide) that may be formed by a high temperature reaction with a metal and P+ region 631. In one embodiment, silicide region 874 can be formed by employing one or more rapid thermal anneal (RTA) processes. In another embodiment, silicide region 874 can be formed by depositing another layer of silicon (e.g., amorphous or polycrystalline) and reacting a metal with the deposited layer.

Mask layer 890 includes patterned regions 891 and 892 for defining locations of trenches to be formed in substrate 320. A single- or multiple-step photolithographic process can be employed to form mask layer 890. In addition or alternatively, one or more "hard" masks (e.g., a patterned oxide layer or other film) or a combination of hard mask and photoresist mask may be used to define patterned regions 891 and 892.

Figure 9A:
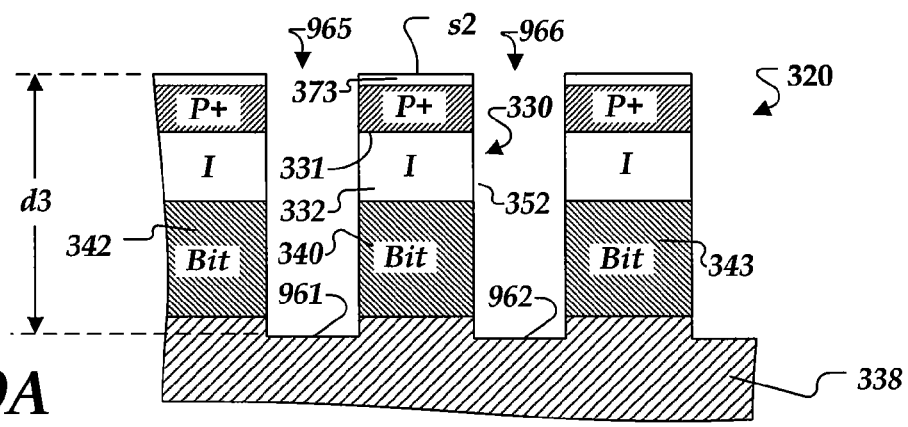

FIG. 9A is a cross-sectional side view of substrate 320 after undergoing an etch process through mask 890 of FIG. 8A to form trenches 965 and 966. Trenches 965 and 966 defined the locations of P+ region 331, intrinsic region 332, and bit lines 340-342. Trenches 965 and 966 have a depth (d3) from a front side surface (s2) of substrate 320 such that trenches 965 and 966 extend into bit body region 338 to form recesses 961 and 962, respectively. In one embodiment, the depth (d3) may be on the order of about 0.5 μm. In another embodiment, recesses 961 and 962 can be configured for a specific between-diode leakage requirement between adjacent PIN diodes. In general, trenches 965 and 966 may be formed by single- or multi-step etch processes employing wet/dry etching techniques.

Figure 10A:
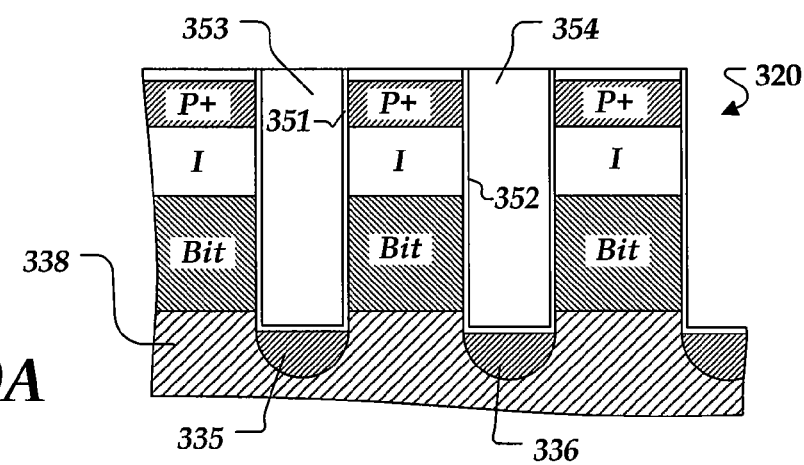

FIG. 10A is a cross-sectional side view of substrate 320 after forming sidewall dielectrics 351 and 352, isolation dielectrics 353 and 354, and P+ isolation regions 335 and 336. Sidewall dielectrics 351 and 352 formed by any of a variety of thermal oxidation processes or deposition process (e.g., physical and/or chemical). Isolation dielectrics 353 and 354 can be formed by a deposition process. In one embodiment, sidewall dielectrics 351 and 352 are a thermal oxide and isolation dielectrics 353 and 354 are a chemical vapor deposited (CVD) oxide, plasma-enhanced CVD (PECVD) oxide, or a high density plasma (HDP) oxide. In another embodiment, sidewall dielectrics 351 and 352 are a polymeric material. In one embodiment, sidewall dielectrics 351 and 352 are configured to mitigate leakage. In another embodiment, sidewall dielectrics 351 and 352 are configured to control the rate of minority recombination in PIN diode 330 of FIGS. 3A and 3B.

P+ isolation region 335 and 336 may be formed by any of a variety of implantation processes, which may occur before or after sidewall dielectrics 351 and 352 are formed. In one embodiment, the concentration of P+ isolation regions 335 and 336 can be configured to be high enough so as to prevent the formation of a fully depleted layer between adjacent bit lines, but also to be low enough so as to prevent band-band direct tunneling when adjacent bit lines and body 338 are biased.

FIGS. 8B-10B generally correspond to the same or similar processing steps described in conjunction with FIGS. 8A-10A, but correspond to a cross-sectional view taken along the same plane as that of FIG. 3B. In some embodiments, however, certain steps carried out in FIGS. 8A-10A may be carried out a different time or a different manner than those described with reference to FIGS. 8B-10B. For example, the etching steps carried out in FIGS. 8A-10A may be combined with or separate from those of FIGS. 8B-10B.

Figure 8B:
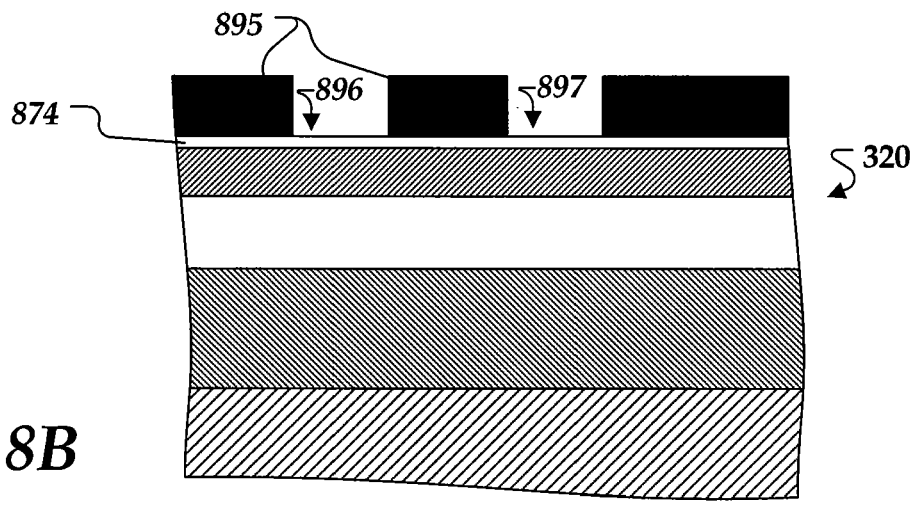

FIG. 8B shows mask layer 895 on top of silicide region 873 and having patterned portions 896 and 897. In one embodiment, mask layer 890 is another mask that is distinct from mask layer 890 of FIG. 8A. In another embodiment, mask layer 895 is the same mask as mask layer 890.

Figure 9B:
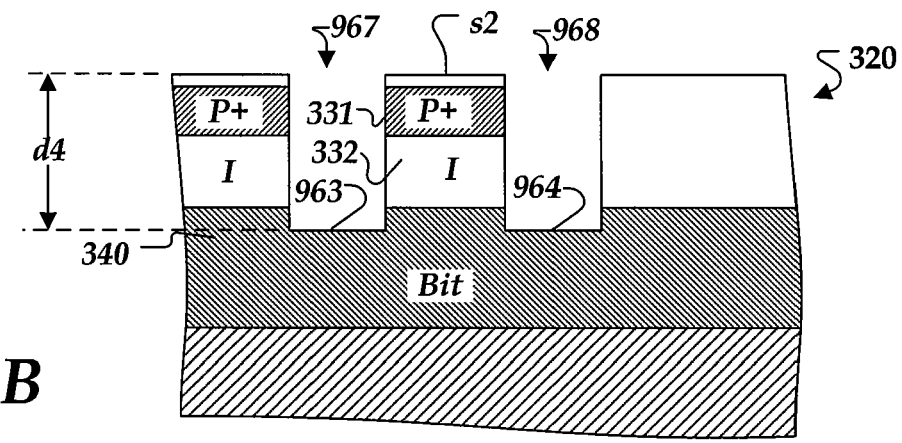

FIG. 9B shows mask layer 895 defining locations of trenches 967 and 968. Trenches 967 and 968 further define the locations of P+ region 331 and intrinsic region 332. Trenches 967 and 968 have a depth (d4) from the front side surface (s2) of substrate 320 such that trenches 967 and 968 extend into bit line 340 to form recesses 963 and 964, respectively. In one embodiment, the depth (d4) may be less than the depth (d3) of FIG. 9A. In general, the depth (d4) may be selected to avoid leakage between adjacent diodes on the same bit line under different bias conditions.

Figure 10B:
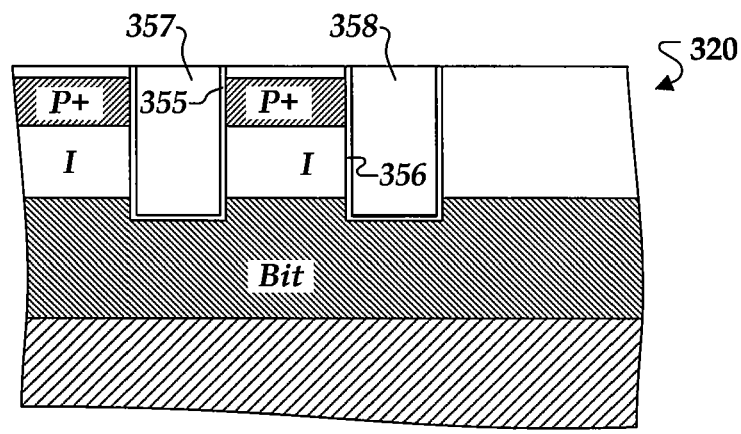

FIG. 10B shows sidewall dielectrics 355 and 356 and isolation dielectrics 357 and 358. Sidewall dielectrics 355 and 356 may be configured to be the same type of material as sidewall dielectrics 351 and 352 of FIG. 10A. Similarly, isolation dielectrics 357 and 358 may be configured to be the same type of material as isolation dielectrics 353 and 354 of FIG. 10A.

Figure 11A:
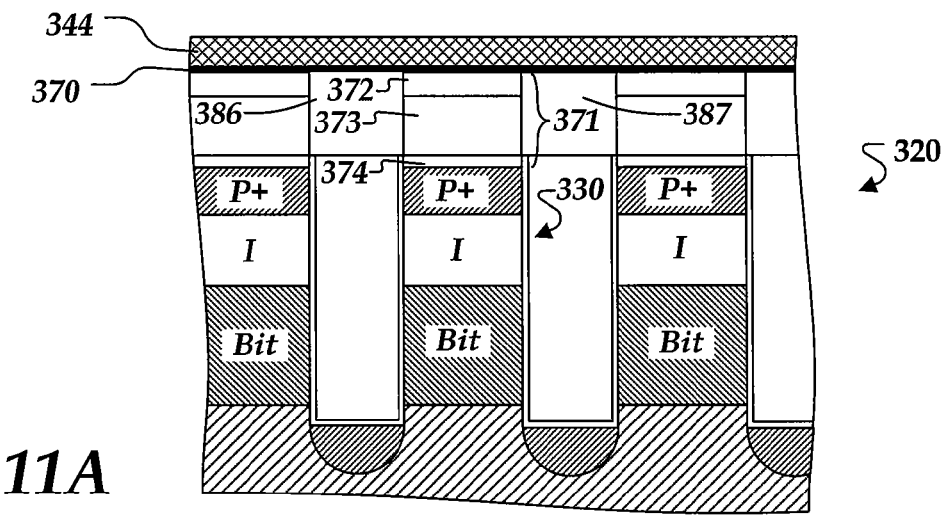

FIG. 11A shows a cross-sectional side view of substrate 320 after forming diode contact 373, bottom electrode 372, word line 344, and memory element 370. Diode contact 373, bottom electrode 372, and word line 344 may include any of a variety of metallic, semiconductor, and/or a combination of one or more of these materials for forming an electrode contact with memory element 370.

Memory element 370 extends above inter-level dielectric regions 386 and 387 and is electrically to word line 344. In one embodiment, memory element 370 can include one or more metal oxide based materials employed in a resistive RAM (ReRAM) based memory. For example, in such an embodiment a memory element can include copper oxide, nickel oxide, zirconium oxide, titanium oxide, hafnium oxide materials or the like. In another embodiment, a memory element can include one or more phase change materials employed in phase-change RAM (PRAM) based memory. In such an embodiment, a memory element can include a chalcogenide element (e.g., sulfur, selenium, or tellurium).

Figure 11B:
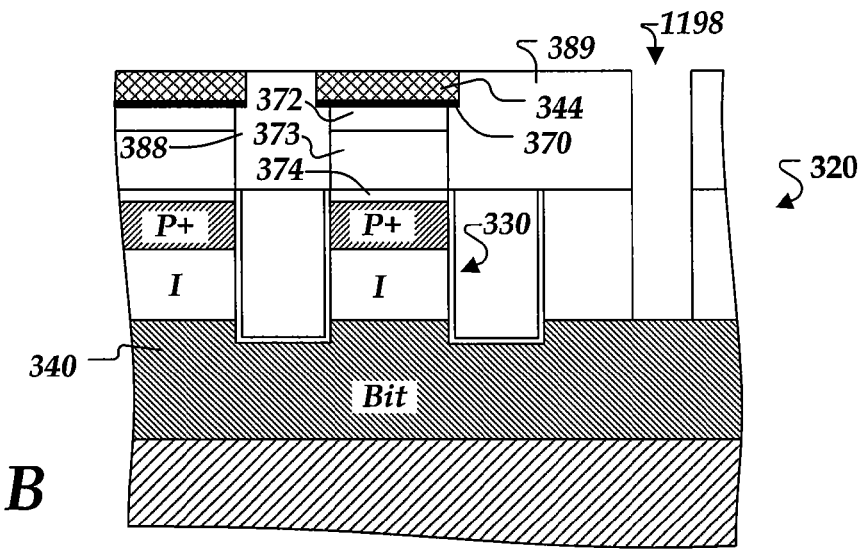

FIG. 11B generally corresponds to the same or similar processing steps described in conjunction with FIG. 11A, but correspond to a cross-sectional view taken along the same plane as that of FIG. 3B. FIG. 11B shows silicide contact 374, diode contact 373, bottom electrode 372, word line 344, and memory element 370. FIG. 11B also shows inter-level dielectric regions 388 and 389 and a trench 1198 formed through inter-level dielectric region 389 and also through a portion of substrate 320. Trench 1198 can be formed by one or more photolithographic process and wet/dry etches processes such that trench 1198 opens to a portion of bit line 340. Trench 1198 may be subsequently filled with a metal or other conductive material to electrically couple bit line 340 with other conductive features.

Although not illustrated, processing may continue. For example, additional inter-level dielectric layers and conductive layers may be stacked upon substrate 320 to interconnect various portions of substrate 320. Further, substrate 320 may be cleaved or cut in various manners to form individual dies or chips that may be incorporated into a packaged device or other device. A person skilled in the art would appreciate the various manners in which such processing and packaging may be carried out.

Further, a variety of simulation and/or software tools may be employed to create a specific implementation of a PIN diode or a memory containing a PIN diode. High-level software code, such as a register transfer logic (RTL) file, may be created and then compiled to form a netlist file. The netlist file may be used in turn to optimize the PIN diode and/or other component configuration in the memory. A physical design process may be employed in conjunction with the netlist file and a component library to create a layout file. The layout file may be used to create a mask file that may be provided to a device foundry to equip the foundry for manufacturing a PIN diode or a memory containing a PIN diode.

Figure 12:
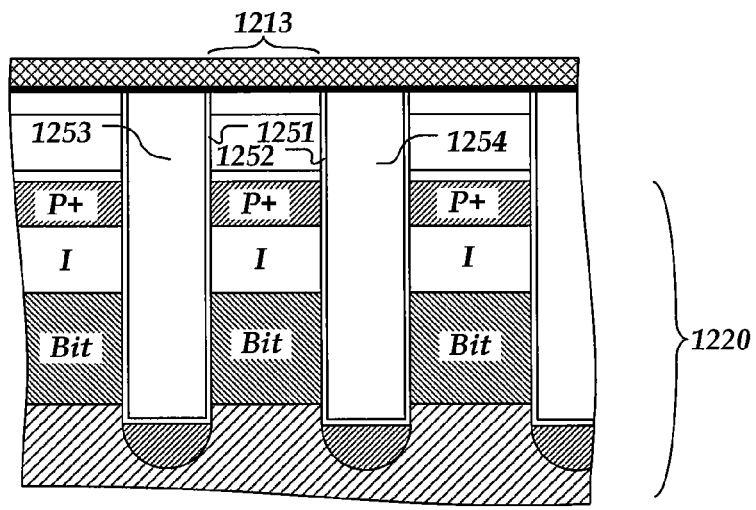
FIG. 12 is cross-sectional side view of another embodiment of a PIN diode coupled to a memory cell.

FIG. 12 shows a cross-sectional side views of an embodiment of PIN diode 1230 coupled to memory cell 1213. PIN diode 1230 and memory cell 1213 may be employed as an embodiment of PIN diode 230 of FIG. 2 and memory cell 103 of FIG. 1, respectively. PIN diode 1230 and memory cell 1213 are generally similar to PIN diode 330 and memory cell 313 of FIGS. 3A and 3B, with at least the exception that sidewall dielectrics 1251 and 1253 and isolation dielectrics 1253 and 1254 extend into a MOL layer or an MOL layer and a BEOL layer. In one embodiment, a dielectric material can be deposited into a continuous trench, or a series of contiguous trenches, extending through substrate 1220 and through an MOL layer and/or an MOL layer and a BEOL layer. In such an example, multiple trench etch processes and/or multiple dielectric deposition processes can be consolidated into fewer processes.

Figure 13:
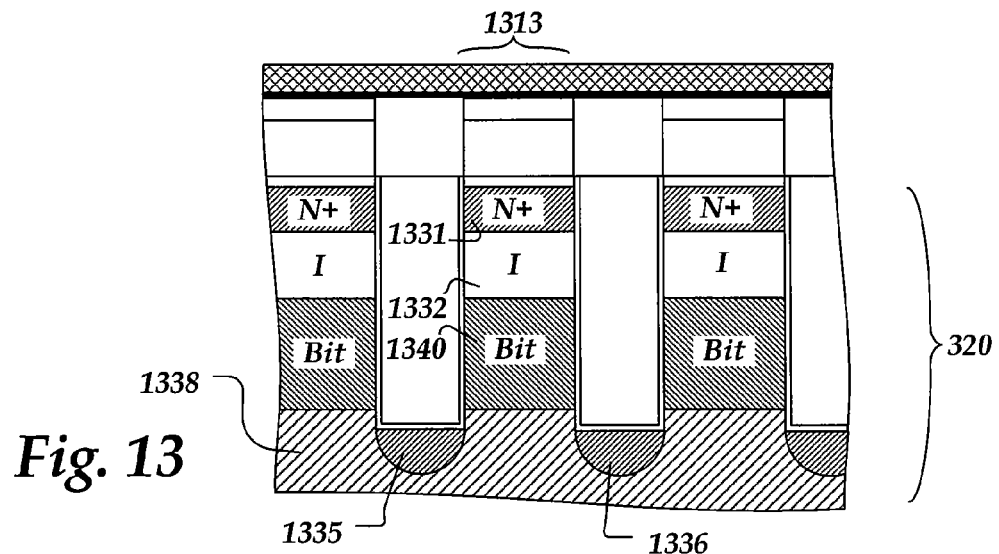
FIG. 13 is a cross-sectional side views of yet another embodiment of a PIN diode coupled to a memory cell.

FIG. 13 shows a cross-sectional side view of an embodiment of PIN diode 1330 coupled to memory cell 1313. PIN diode 1330 and memory cell 1313 may be employed as an embodiment of PIN diode 230 of FIG. 2 and memory cell 103 of FIG. 1, respectively. PIN diode 1330 and memory cell 1313 are generally similar to PIN diode 330 and memory cell 313 of FIGS. 3A and 3B, with at least the exception that bit line 1340 is p-type, n-body 1338 is n-type, N+ isolation regions 1361 and 1363 are n-type, and N+ region 1331 is n-type. Also, embodiments of memory cell 1313 can also include isolation dielectrics that extend into an MOL layer or an MOL layer and a BEOL layer.

Figure 14:
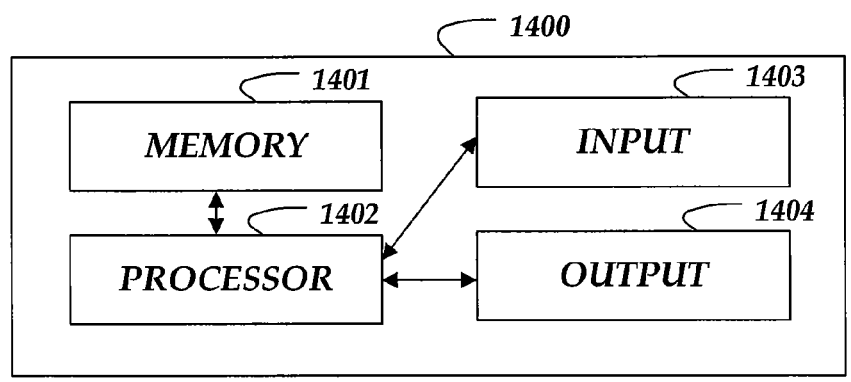
FIG. 14 is block diagram of a system that may incorporate embodiments of a PIN diode and/or a memory employing a PIN diode.

Embodiments of PIN diodes and/or memory employing PIN diodes can be incorporated into any of a variety of components and/or systems, including for example, a processor and other components or systems of such components. FIG. 14 shows one embodiment of a system (1400) that may incorporate PIN diodes and/or memory employing PIN diodes in memory 1401. Memory 1401 may include, for example, any one of the aforementioned memories, such as single-bit, dual-bit, or multi-bit flash memory. Memory 1401 can be directly or indirectly to any one of processor 1402, input devices 1403, and/or output devices 1404. In one embodiment, memory 1401 may be configured such that it is removable from the system (1400). In another embodiment, memory 1401 may be permanently connected to the components or a portion of the components of the system (1400).

In many embodiments, memory 1401, processor 1402, input devices 1403, and/or output devices 1404 of the system (1400) are configured in combination to function as part of a larger system. For example, the system (1400) may be incorporated into a cell phone, a handheld device, a laptop computer, a personal computer, and/or a server device. In addition or alternatively, the system (1400) can perform any of variety of processing, controller, and/or data storage functions, such as those associated with sensing, imaging, computing, or other functions. Accordingly, the system (1400) can be incorporated into any of wide variety of devices that may employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A memory, comprising a substrate that includes:
   a buried bit/word line;
   a PIN diode that includes a non-intrinsic semiconductor region, a portion of the bit/word line, and an intrinsic semiconductor region positioned between the non-intrinsic region and the portion of the bit/word line.

2. The memory of claim 1, wherein the PIN diode spans a vertical portion of the substrate, and wherein the bit/word line spans a lateral portion of the substrate that is generally perpendicular to the PIN diode.

3. The memory of claim 1, wherein the portion of the bit/word line has a majority acceptor concentration or a majority donor concentration, wherein the majority acceptor concentration or the majority donor concentration is greater than or equal to about $1 \times 10^{20}$ cm$^{-3}$.

4. The memory of claim 1, wherein the intrinsic region has a majority acceptor concentration or a majority donor concentration, wherein the majority acceptor concentration or the majority donor concentration is less than or equal to about $1 \times 10^{16}$ cm$^{-3}$.

5. The memory of claim 1, further comprising a memory element that includes at least one of a resistive RAM based memory element or a phase-change RAM based memory element, wherein the non-intrinsic region of the PIN diode is coupled between the memory element and the intrinsic region of the PIN diode.

6. The memory of claim 1, further comprising a logic state component coupled to the PIN diode and arranged to receive a signal via the PIN diode,
wherein the logic state component includes means for storing a logic state, or wherein the PIN diode includes means for regulating the signal.

7. The memory of claim 1, further comprising an electrode contact, wherein the non-intrinsic region of the PIN diode is coupled between the electrode contact and the intrinsic region of the PIN diode, and wherein PIN diode has a smaller footprint than the electrode contact.

8. The memory of claim 1, wherein the bit/word line includes a bit line, wherein the memory further includes a word line, and wherein the non-intrinsic region and the intrinsic region of the PIN diode are positioned between a portion of the bit line and a portion of the word line.

9. The memory of claim 1, further comprising:
a metal contact that is carried by the substrate; and
a metal interconnect extending through a portion of the substrate and electrically coupling another portion of the bit/word line with the metal contact.

10. A system, comprising:
a memory array that includes:
a plurality of memory cells that is configured to store data;
a semiconductor bit/word line that is coupled to at least a portion of the plurality of memory cells;
a PIN diode that includes a portion of the bit/word line; and
another PIN diode that includes another portion of the bit/word line, wherein the other PIN diode is spaced apart from the PIN diode by a dielectric layer, and wherein the other PIN diode has, at least, a non-intrinsic semiconductor region, another non-intrinsic semiconductor region formed in the other portion of the bit/word line, and an intrinsic region separating the non-intrinsic region from the other non-intrinsic region.

11. The system of claim 10, further comprising:
one or more sense amps;
a decoder coupled between the sense amps and the plurality of memory cells; and
a memory controller coupled to the decoder and the sense amps such that the memory controller is enabled to read from and/or write to individual memory cells through at least one conduction path that includes at least a portion of the decoder, at least one of the sense amps, the bit/word line, and the other PIN diode.

12. The system of claim 10, wherein the other PIN diode further includes a sidewall adjacent to the non-intrinsic region and the intrinsic region, wherein the sidewall is at least partially lined with a dielectric layer.

13. The system of claim 10, further comprising:
an electrode contact corresponding to the PIN diode;
another electrode contact corresponding to the other PIN diode, wherein the non-intrinsic region is positioned between the other electrode contact and the intrinsic region; and
an isolation dielectric layer extending between the PIN diode and the other PIN diode, wherein the isolation dielectric layer also extends between the electrode contact and the other electrode contact.

14. The system of claim 10, wherein the bit/word line is coupled to the PIN diode, and wherein the bit/word line includes a recess that is positioned between the PIN diode and the other PIN diode.

15. The system of claim 10, further comprising another bit/word line, wherein the PIN diode is coupled to the other bit/word line, and wherein an isolation dielectric layer and/or a recess in a semiconductor body region separates the bit/word line from the other bit/word line.

16. A fabrication method, comprising:
implanting a first implant species such that a non-intrinsic semiconductor region is formed at a first depth in a semiconductor substrate, wherein the non-intrinsic semiconductor region has a first majority carrier type;
implanting a second implant species such that another non-intrinsic semiconductor region is formed at a second depth in the substrate that is less than the first depth, and such that the non-intrinsic region is separated from the other non-intrinsic region, wherein the other non-intrinsic region has a second majority carrier type that is different than the first majority carrier type; and
forming at least one trench in the substrate to define a location of a bit/word line and a location of a PIN diode such that the PIN diode includes a portion of the bit/word line and a portion of the non-intrinsic region.

17. The method of claim 16, further comprising implanting a third implant species such that an intrinsic region is formed between the portion of the bit/word line and the portion of the non-intrinsic region.

18. The method of claim 16, further comprising:
forming a metal interconnect that extends through a portion of the substrate such that the metal interconnect is electrically coupled with another portion of the bit/word line; and
forming a metal contact that is electrically coupled to the interconnect.

19. The method of claim 16, further comprising forming a recess in the bit/word line that is located between the PIN diode and another PIN diode.

20. The method of claim 16, further comprising forming a recess in a semiconductor body region that is located between the bit/word line and another bit/word line.

* * * * *

UNITED STATES PATENT AND TRADEMARK OFFICE
CERTIFICATE OF CORRECTION

PATENT NO. : 7,916,529 B2  
APPLICATION NO. : 12/370932  
DATED : March 29, 2011  
INVENTOR(S) : Wai Lo et al.

Page 1 of 1

It is certified that error appears in the above-identified patent and that said Letters Patent is hereby corrected as shown below:

On the Title Page, in item (56), under (Other Publications), in column 2, line 6, delete "90nrm" and insert -- 90 nm --, therefor.

On the Title Page, in item (74), in Attorney, Agent, or Firm, in column 2, line 1, delete "Matthew W." and insert -- Matthew M. --, therefor.

In column 2, line 11, delete "silicion" and insert -- silicon --, therefor.

In column 6, line 5, delete "intrinsice" and insert -- intrinsic --, therefor.

In column 6, line 8, delete "intrinsice" and insert -- intrinsic --, therefor.

In column 6, line 14, delete "posssible." and insert -- possible. --, therefor.

Signed and Sealed this  
Twenty-sixth Day of July, 2011

David J. Kappos  
*Director of the United States Patent and Trademark Office*